United States Patent [19]

Jeong

[11] Patent Number: 5,680,359

[45] Date of Patent: Oct. 21, 1997

[54] SELF-REFRESH PERIOD ADJUSTMENT CIRCUIT FOR SEMICONDUCTOR MEMORY DEVICE

[75] Inventor: Dong Sik Jeong, Kyoungki-do, Rep. of Korea

[73] Assignee: Hyundai Electronics Industries Co., Ltd., Kyoungki-do, Rep. of Korea

[21] Appl. No.: 619,221

[22] Filed: Mar. 21, 1996

[30]    Foreign Application Priority Data

Mar. 24, 1995  [KR]  Rep. of Korea .................. 95-6320

[51] Int. Cl.⁶ .................................................. G11C 11/402
[52] U.S. Cl. ........................ 365/222; 365/211; 365/189.07
[58] Field of Search .................................. 365/222, 211, 365/189.07, 189.09

[56]    References Cited

U.S. PATENT DOCUMENTS

| | | | |
|---|---|---|---|
| 4,716,551 | 12/1987 | Inagaki | 365/222 |
| 5,278,796 | 1/1994 | Tilinghast et al. | 365/222 |
| 5,495,452 | 2/1996 | Cha | 365/222 |
| 5,532,968 | 7/1996 | Lee | 365/222 |
| 5,596,533 | 1/1997 | Park | 365/189.04 |

Primary Examiner—Tan T. Nguyen
Attorney, Agent, or Firm—Gary M. Nath; Nath & Associates

[57]    ABSTRACT

A self-refresh period adjustment circuit for a semiconductor memory device. The self-refresh period adjustment circuit comprises a ring oscillator for generating a pulse signal with a fixed period for a self-refresh operation of the semiconductor memory device, a leakage current detector for detecting the amount of leakage current produced as charges stored in memory cells in the semiconductor memory device are discharged, and at least two temperature detectors for detecting a temperature variation of the semiconductor memory device, each of the at least two temperature detectors including a voltage divider and a comparator. The voltage divider divides a supply voltage and supplies the divided result as a reference signal to the comparator. The comparator compares an output signal from the leakage current detector with the reference signal from the voltage divider. The self-refresh period adjustment circuit further comprises at least two frequency dividers, each of the at least two frequency dividers dividing a frequency of an output signal from the ring oscillator at a desired ratio in response to an output signal from a corresponding one of the at least two temperature detectors to adjust a self-refresh period of the semiconductor memory device.

5 Claims, 6 Drawing Sheets (b)

(c)

SELF-REFRESH PERIOD ADJUSTMENT CIRCUIT FOR SEMICONDUCTOR MEMORY DEVICE

BACKGROUND OF THE INVENTION

1. Field of the Invention

The present invention relates in general to self-refresh period adjustment circuits for semiconductor memory devices, and more particularly to a self-refresh period adjustment circuit for a semiconductor memory device which is capable of detecting temperature variations in the semiconductor memory device according to the amount of current leaking from memory cells in the semiconductor memory device and adjusting a self-refresh period of the semiconductor memory device in accordance with the detected temperature variation.

2. Description of the prior Art

A dynamic random access memory (referred to hereinafter as DRAM) has been known as one of a number of popular semiconductor memory devices to be used in information processing systems such as electronic computers or the like. The DRAM comprises a plurality of memory cells, each of which includes a MOSFET as a transfer gate and a capacitor. In this dynamic memory, information stored in each of the memory cells in the DRAM is determined as "1" or "0" by existence or non-existence of electric charge stored in the capacitor. Such type of memories are described, for example, in U.S. Pat. No. 4,045,783. However, in this type of memory, the charge stored in the capacitor is gradually discharged through a leakage path, e.g., between electrodes thereof. For this reason, a rewriting operation must be performed at a predetermined time interval to recharge the capacitor to maintain the information stored in the capacitor. Such a rewriting operation is called a "refresh operation" and such a time interval is referred to as a "refresh period" or "refresh time interval".

Generally, the above-mentioned capacitors are formed integrally on a semiconductor substrate constructing a semiconductor memory device such as the DRAM. In the semiconductor memory device, a portion of the semiconductor substrate is used as one electrode of the capacitor. An insulating film is formed on the semiconductor substrate to be used as a dielectric layer. A conductive layer is deposited on the insulating film to be used as the other electrode of the capacitor. Such type of memories are described, for example, in U.S. Pat. No. 3,810,125. In this instance, the information stored in each memory cell is maintained in the form of an electric charge retained at boundaries of the dielectric layer and the respective electrodes.

However, the amount of charge stored in the capacitor is gradually reduced because it is discharged through a leakage path between the opposite electrodes of the capacitor. The rate of reduction increases considerably as the ambient temperature rises. For this reason, the refresh period must be shortened to compensate for the amount of charge lost through the leakage path. However, the refresh period is set to a fixed value in conventional semiconductor memory devices.

On the other hand, a large amount of power is consumed for the refresh operation. In order to reduce such power consumption, the DRAM chip has a tendency to require a self-refresh function in which all memory cells in the chip are sequentially refreshed as a counter in the chip is operated when several tens µs has elapsed in a typical CBR mode (CAS before RAS mode).

However, a large amount of power is consumed even for the self-refresh operation because much cell data is reamplified every refresh period. Here, the amount of power consumption is determined according to the refresh period.

The refresh period affecting the bower consumption is determined based on the cell data maintenance time as mentioned above. The cell data maintenance time is in close connection with a temperature variation of the chip. Namely, the cell data maintenance time becomes shorter as the temperature rises. For this reason, a conventional self-refresh operation period is short in consideration of the cell data maintenance time at high temperatures. However, the conventional self-refresh operation period is still short even in the case where the cell data maintenance time becomes longer as the chip is operated at low temperatures. As a result, when the chip is operated at low temperatures, the conventional self-refresh operation period results in power being excessively consumed.

Referring to FIG. 1, there is shown a schematic block diagram of a conventional self-refresh period adjustment circuit for a semiconductor memory device. As shown in this drawing, the conventional self-refresh period adjustment circuit comprises a plurality of temperature detectors 10 for detecting temperature variations of the semiconductor memory device, a plurality of ring oscillators 11 for generating pulse signals with different periods in response to output signals from temperature detectors 10, respectively, and a self-refresh period generator 13 for generating a self-refresh period in response to output signals from the ring oscillators 11.

Referring to FIG. 2, there is shown a detailed circuit diagram of each or the temperature detectors 10 in FIG. 1. As shown in this drawing, the temperature detector includes poly resisters R1 and R4 with a small resistance variation with the temperature variation of the semiconductor memory device, and active resisters R2 and R3 with a large resistance variation with the temperature variation of the semiconductor memory device. The temperature detector is adapted to detect the temperature variations of the semiconductor memory device by differentially amplifying a voltage between nodes N1 and N2 using the poly resistors R1 and R4 and the active resistors R2 and R3.

The ring oscillators 11 are at least two in number, which are operated in response to the output signals from the temperature detectors 10, respectively, to generate pulse signals with different periods. The ring oscillators 11 are adapted to be operated only within the range of a predetermined temperature. Therefore, the use of ring oscillators makes it possible to adjust the refresh period according to the temperature variations. In this manner, the conventional self-refresh period adjustment circuit is adapted to adjust the refresh period using the two resistor devices with different resistance variations with the temperature variations. However, the above-mentioned conventional self-refresh period adjustment circuit has a disadvantage in that it requires an equal amount or ring oscillators as there are temperature detectors, thereby increasing the cost and size of the chip.

SUMMARY OF THE INVENTION

Therefore, the present invention has been made in view of the above problems, and it is an object of the present invention to provide a self-refresh period adjustment circuit for a semiconductor memory device which is capable of detecting temperature variations in the semiconductor memory device according to the amount of current leaking from memory cells in the semiconductor memory device and adjusting a self-refresh period of the semiconductor memory device in accordance with the detected temperature variation, thereby securing the safety of data stored in the memory cells and reducing the amount of power consumption at relatively low or normal temperatures.

In accordance with the present invention, the above and other objects can be accomplished by a provision of a self-refresh period adjustment circuit for a semiconductor memory device, the semiconductor memory device comprising a plurality or memory cell arrays, each or the memory cell arrays including a plurality of memory cells for storing data therein, comprising a ring oscillator for generating a pulse signal with a fixed period for a self-refresh operation of the semiconductor memory device; leakage current detection means for detecting the amount of leakage current produced as charges stored in the memory cells are discharged; at least two temperature detection means for detecting a temperature variation of the semiconductor memory device, each of the at least two temperature detection means including voltage division means and comparison means, the voltage division means dividing a supply voltage and supplying the divided result as a reference signal to the comparison means, the comparison means comparing an output signal from the leakage current detection means with the reference signal from the voltage division means; and at least two frequency division means, each of the at least two frequency division means dividing a frequency of an output signal from the ring oscillator at a desired ratio in response to an output signal from a corresponding one of the at least two temperature detection means to adjust a self-refresh period of the semiconductor memory device.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
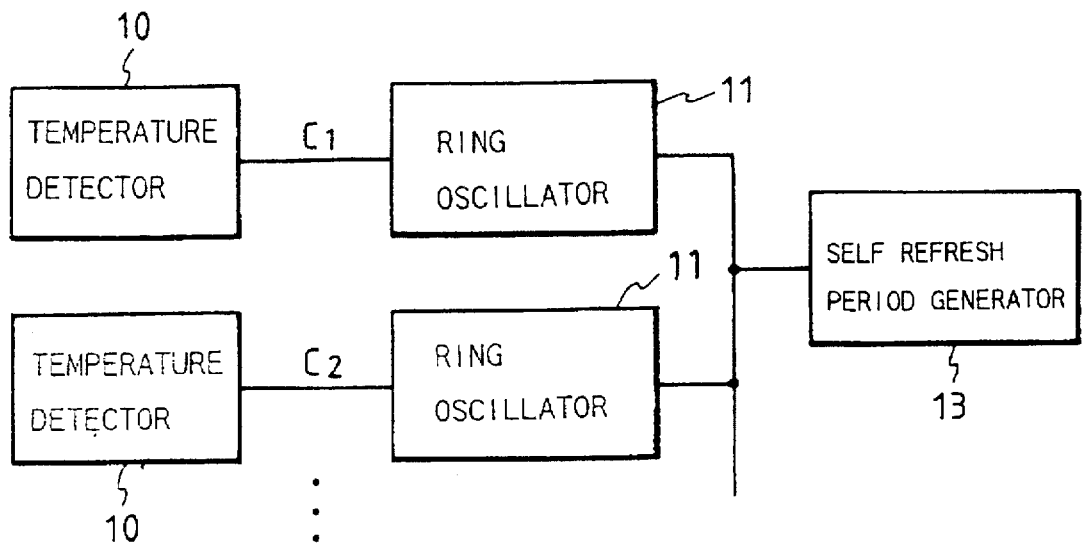
FIG. 1 is a schematic block diagram of a conventional self-refresh period adjustment circuit for a semiconductor memory device.
Figure 3:
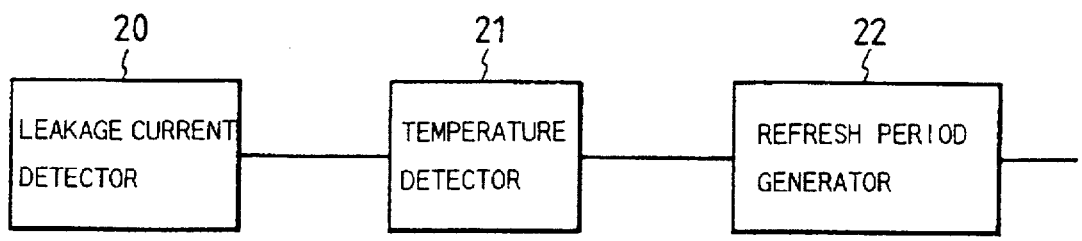
FIG. 3 is a schematic block diagram of a self-refresh period adjustment circuit for a semiconductor memory device in accordance with the present invention.
Figure 2:
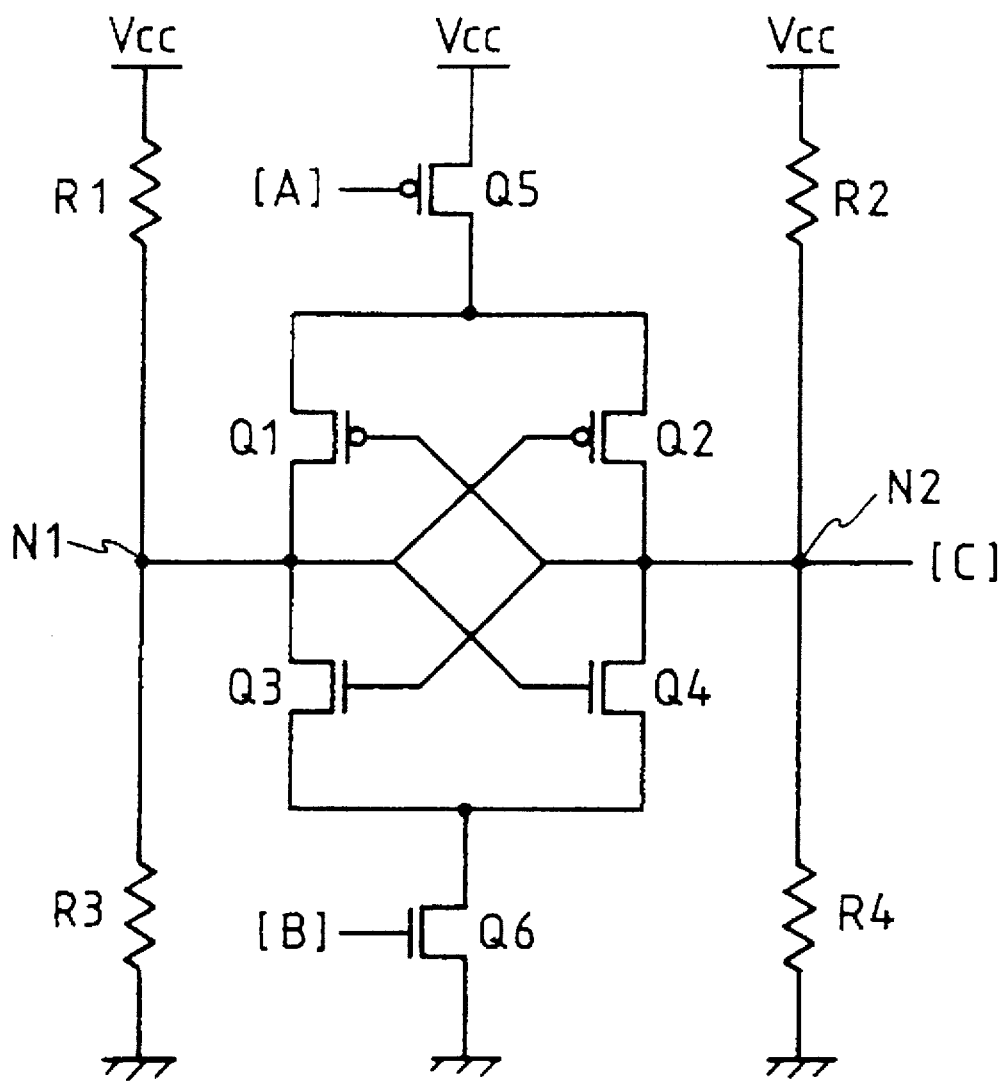
FIG. 2 is a detailed circuit diagram of a temperature detector in FIG. 1.

Referring to FIG. 3, there is shown a schematic block diagram of a self-refresh period adjustment circuit for a semiconductor memory device in accordance with the present invention. As shown in this drawing, the self-refresh period adjustment circuit comprises a leakage current detector 20 for detecting a leakage current amount produced as charges stored in memory cells of the semiconductor memory device are discharged through a leakage path, a temperature detector 21 for comparing an output signal from the leakage current detector 20 with a reference voltage to detect a temperature variation of the semiconductor memory device, and a self-refresh period generator 22 for generating a self-refresh period in response to an output signal from the temperature detector 21.

Figure 4:
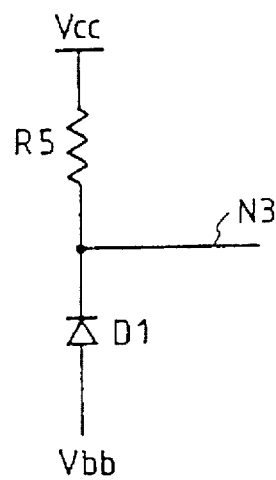
FIG. 4A is a detailed circuit diagram of a leakage current detector in FIG. 3.
FIG. 4B is a sectional view illustrating an embodiment of the leakage current detector in FIG. 3.
FIG. 4C is a sectional view illustrating an alternative embodiment of the leakage current detector in FIG. 3.
Figure 4:
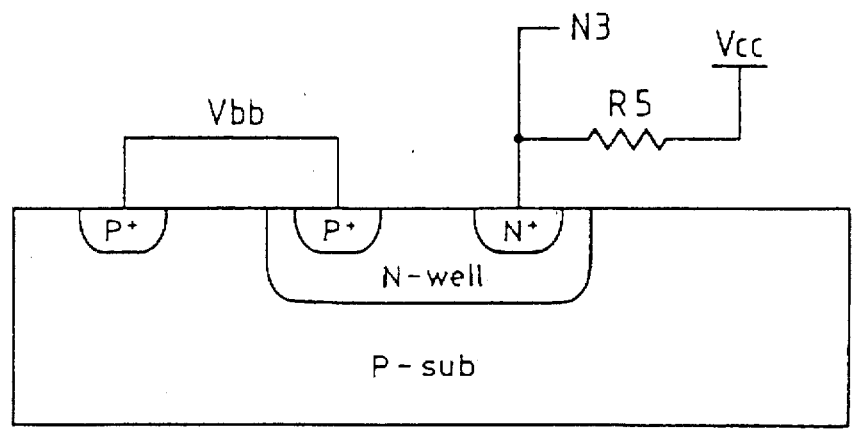
Figure 4:
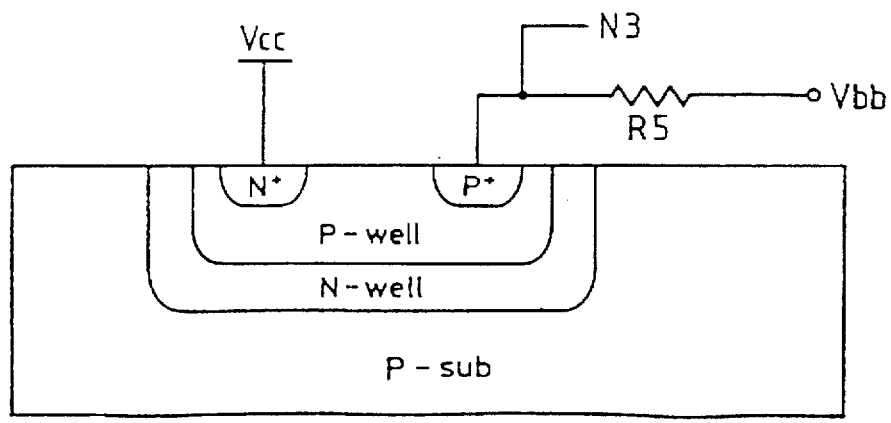

Referring to FIG. 4A, there is shown a detailed circuit diagram of the leakage current detector 20 in FIG. 3. The leakage current detector 20 is adapted to detect the amount of current leaking from memory cells in a semiconductor memory device such as a DRAM.

As shown in FIG. 4A, the leakage current detector 20 includes a resistor R5 and a diode D1 connected in series between a source of a supply voltage Vcc and a source of a substrate voltage Vbb, and an output terminal N3 connected between the resistor R5 and the diode D1. With this construction, the leakage current detector 20 can detect the leakage current amount when a reverse bias is applied to the diode D1. A voltage proportional to the leakage current, namely, V=IR is generated at the output terminal N3. Here, because the current I is the leakage current which varies with the temperature variations, the voltage V at the output terminal N3 also varies with the temperature variations. Namely, the leakage current is in close connection with the temperature. For example, when the temperature increases by 10° C., the leakage current is doubled in amount.

Referring to FIG. 4B, there is shown a sectional view illustrating an embodiment of the leakage current detector 20 in FIG. 3. As shown in this drawing, an N-type well is formed on a P-type substrate. Impurity diffusion regions doped with $P^+$-type ions are formed on the P-type substrate and the N-type well, respectively. The $P^+$-type impurity diffusion regions are applied with the substrate voltage Vbb. An impurity diffusion region doped with $N^+$-type ions is formed on the N-type well. The $N^+$-type impurity diffusion region is applied with the supply voltage Vcc through the resistor R5.

Referring to FIG. 4C, there is shown a sectional view illustrating an alternative embodiment of the leakage current detector 20 in FIG. 3. As shown in this drawing, an N-type well is formed on a P-type substrate. A P-type well is formed on the N-type well. An impurity diffusion region doped with $N^+$-type ions and an impurity diffusion region doped with $P^+$-type ions are formed on the P-type well. The $N^+$-type impurity diffusion region is applied with the supply voltage Vcc and the $P^+$-type impurity diffusion region is applied with the substrate voltage Vbb through the resistor R5.

Figure 5:
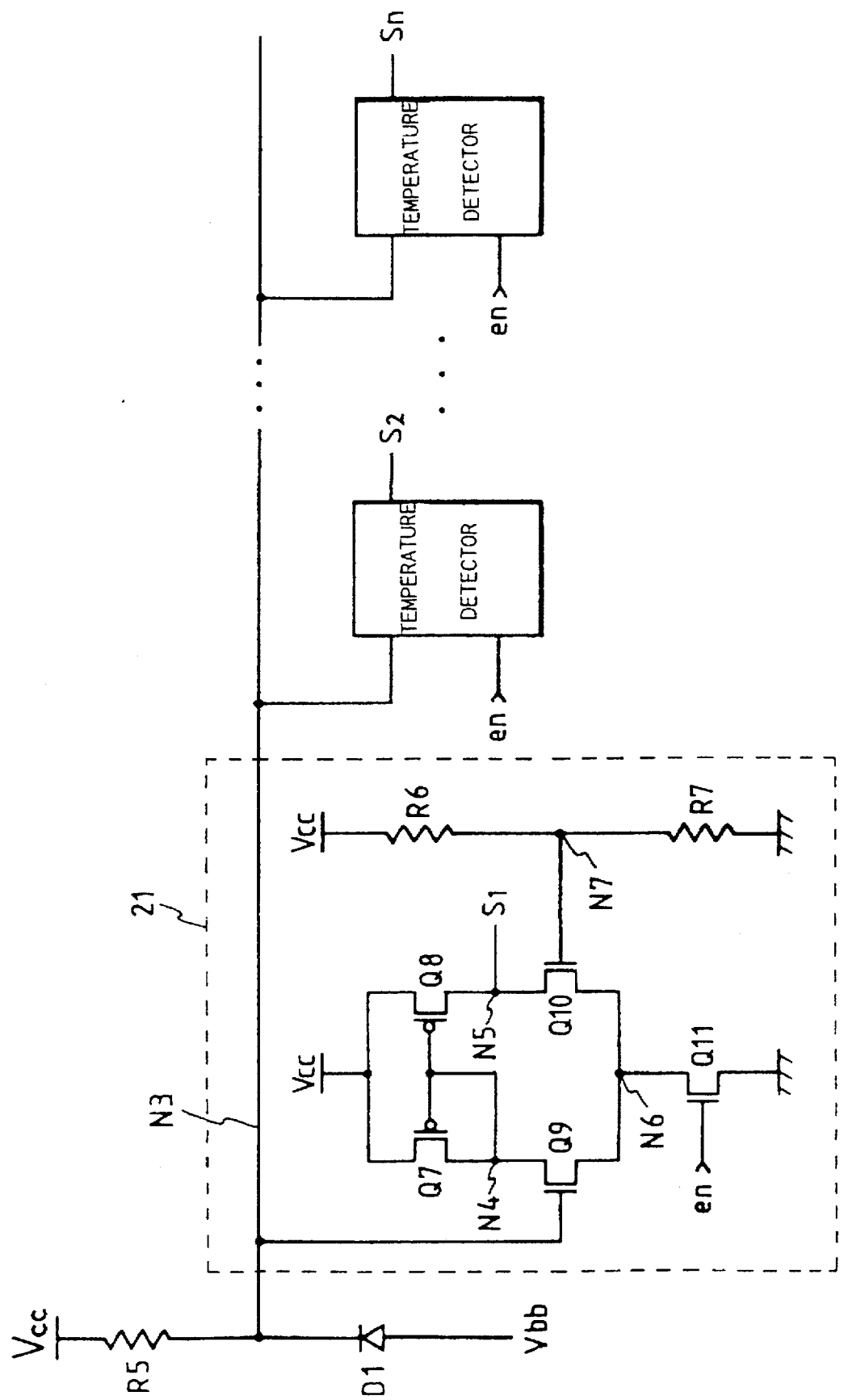
FIG. 5 is a detailed circuit diagram of a temperature detector in FIG. 3.

Referring to FIG. 5, there is shown a detailed circuit diagram of the temperature detector 21 in FIG. 3. As shown in this drawing, the temperature detector 21 includes a PMOS transistor Q7 connected between the supply voltage source Vcc and a node N4, a PMOS transistor Q8 connected between the supply voltage source Vcc and a node N5, an NMOS transistor Q9 connected between the node N4 and a node N6, an NMOS transistor Q10 connected between the nodes N5 and N6, and an NMOS transistor Q11 connected between the node N6 and a source of a ground voltage Vss. The PMOS transistors Q7 and Q8 have their gate terminals connected in common to the node N4. The NMOS transistor Q9 has its gate terminal connected to the output terminal N3 of the leakage current detector 20 and the NMOS transistor Q10 has its gate terminal connected to a node N7. The NMOS transistor Q11 has its gate terminal for inputting an enable signal en. The transistors Q7, Q8, Q9 and Q10 constitute a comparison circuit.

The temperature detector 21 further includes a resistor R6 connected between the supply voltage source Vcc and the node N7, a resistor R7 connected between the node N7 and voltage ground voltage source Vss, and an output terminal connected to the node N5.

In accordance with the preferred embodiment of the present invention, the self-refresh period adjustment circuit comprises a plurality of temperature detectors 21 connected to the output terminal N3 of the leakage current detector 20, for detecting the temperature in response to the leakage current level from the leakage current detector 20. The plurality of temperature detectors 21 are the same in construction.

The two resistor devices R6 and R7 have different resistance variations with the temperature variations. Also, the two resistor devices R6 and R7 constitute a voltage divider for dividing the supply voltage Vcc and supplying the divided voltage as the reference voltage to the nods N7. If a voltage at the output terminal N3 of the leakage current detector 20 is higher than the divided voltage at the node N7, the NMOS transistor Q9 is turned on because its gate terminal is connected to the output terminal N3 of the leakage current detector 20. As the NMOS transistor Q9 is turned on, the PMOS transistors Q7 and Q8 are turned on. As a result, a voltage at the node N5 becomes high in level. To the contrary, the voltage at the output terminal N3 of the leakage current detector 20 is lower than the divided voltage at the node N7, the NMOS transistor Q10 is turned on, thereby causing the voltage at the node N5 to become low in level.

Figure 6:
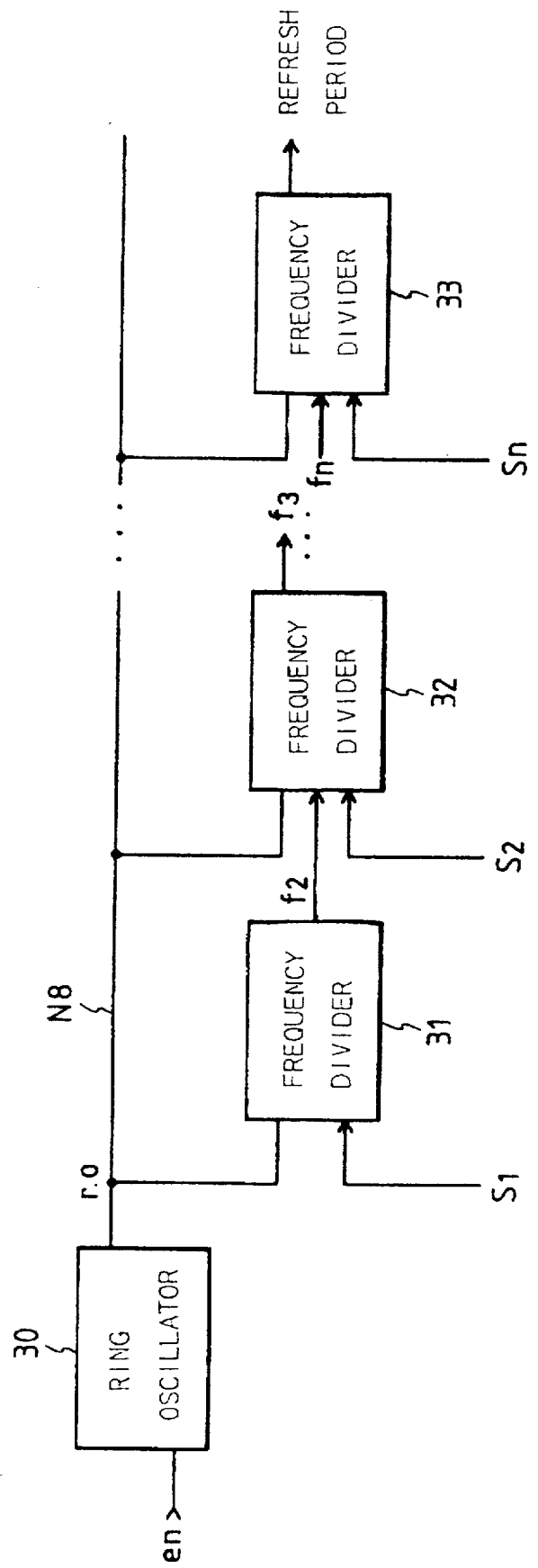
FIG. 6 is a detailed block diagram of a self-refresh period generator in FIG. 3.

Referring to FIG. 6, there is shown a detailed block diagram of the self-refresh period generator 22 in FIG. 3. As shown in this drawing, the self-refresh period generator 22 includes a ring oscillator 30 for generating a pulse signal with a fixed period, and a plurality of frequency dividers 31–33 for increasing the period of an output signal from the ring oscillator 30 by n times in response to an output signal from a corresponding one of the temperature detectors 21. With this construction, the self-refresh period generator 22 supplies the period of the output signal from the ring oscillator 30 directly as the refresh period at high temperatures. At normal or relatively low temperatures, the self-refresh period generator 22 supplies periods of output signals from the frequency dividers 31–33 as the refresh period.

Figure 7:
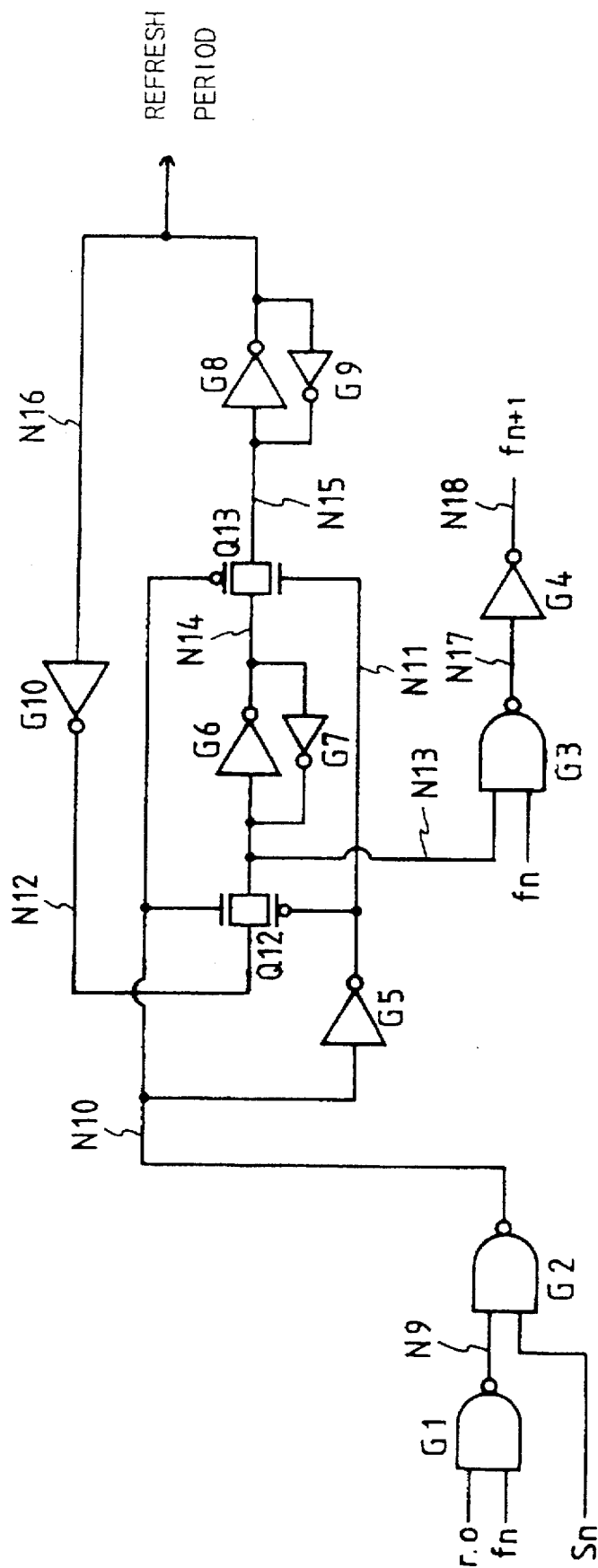
FIG. 7 is a detailed circuit diagram of a frequency divider in FIG. 6.

Referring to FIG. 7, there is shown a detailed circuit diagram of each of the frequency dividers 31–33 in FIG. 6. As shown in this drawing, the frequency divider includes a NAND gate G1 for NANDing an output signal r.o from the ring oscillator 30 and an input signal fn (the supply voltage Vcc in case of the first frequency divider 31) and supplying the NANDed result to a node N9, a NAND gate G2 for NANDing a signal at the node N9 and an output signal Sn from the temperature detector 21 and supplying the NANDed result to a node N10, an inverter G5 connected between the node N10 and a node N11, and a transfer transistor Q12 for transferring a signal at a node N12 to a node N13. The transfer transistor Q12 has its NMOS gate terminal connected to the node N10 and its PMOS gate terminal connected to the node N11.

The frequency divider further includes inverters G6 and G7 connected in parallel between the node N13 and a node N14, and a transfer transistor Q13 for transferring a signal at the node N14 to a node N15. The transfer transistor Q13 has its PMOS gate terminal connected to the node N10 and its NMOS gate terminal connected to the node N11.

The frequency divider further includes inverters G8 and G9 connected in parallel between the node N15 and a node N16, an inverter G10 connected between the nodes N16 and N12, an output terminal for outputting a refresh period from the node N16, a NAND gate G3 for NANDing a signal at the node N13 and the input signal fn and supplying the NANDed result to a node N17, an inverter G4 connected between the node N17 and a node N18, and an output terminal connected to the node N18.

with this construction, each of the frequency dividers 31–33 is controlled in response to the output signal Sn from the corresponding temperature detector 21 to provide its output signal with double the period of the input signal fn. As a result, the refresh period is adjusted based on the output signal Sn from the temperature detector 21 to the corresponding frequency divider. At high temperatures, the period of the output signal from the ring oscillator 30 is used directly as the refresh period, thereby causing the refresh period to become shorter. At normal or relatively low temperatures, the period of the output signal from the frequency divider selected by the output signal Sn from the temperature detector 21 is used as the refresh period, thereby causing the refresh period to become longer.

As apparent from the above description, according to the present invention, the self-refresh period adjustment circuit can detect the temperature variations of the semiconductor memory device according to the amount of current leaking from the memory cells in the semiconductor memory device and adjust the self-refresh period of the semiconductor memory device in accordance with the detected temperature variation. Therefore, unnecessary power consumption can be avoided. This has the effect of embodying a low-consumption power chip.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A self-refresh period adjustment circuit for a semiconductor memory device, said semiconductor memory device comprising a plurality of memory cell arrays, each of said memory cell arrays including a plurality of memory cells for storing data therein, comprising:

a ring oscillator for generating a pulse signal with a fixed period for a self-refresh operation of said semiconductor memory device;

leakage current detection means for detecting an amount of leakage current produced as charges stored in said memory cells are discharged;

at least two temperature detection means for detecting a temperature variation of said semiconductor memory device, each of said at least two temperature detection means including voltage division means and comparison means, said voltage division means dividing a supply voltage and supplying the divided result as a reference signal to said comparison means, said comparison means comparing an output signal from said leakage current detection means with the reference signal from said voltage division means; and at least two frequency division means, each of said at least two frequency division means dividing a frequency of an output signal from said ring oscillator at a desired ratio in response to an output signal from a corresponding one of said at least two temperature detection means to adjust a self-refresh period of said semiconductor memory device.

2. A self-refresh period adjustment circuit for a semiconductor memory device as set forth in claim 1, wherein said leakage current detection means includes:

a resistor and a diode connected in series between a source of the supply voltage and a source of a substrate voltage; and an output terminal connected between said resistor and said diode;

whereby the leakage current amount is detected when a reverse bias is applied to said diode.

3. A self-refresh period adjustment circuit for a semiconductor memory device as set forth in claim 1, wherein said voltage division means includes:

two resistors connected in series between a source of the supply voltage and a source of a ground voltage, said two resistors having different resistance variations with the temperature variation of said semiconductor memory device; and an output terminal connected between said two resistors.

4. A self-refresh period adjustment circuit for a semiconductor memory device as set forth in claim 1, wherein said leakage current detection means includes:

an N-type well formed on a P-type substrate;

first and second $P^+$-type impurity diffusion regions formed on said P-type substrate and said N-type well, respectively, said first and second $p^+$-type impurity diffusion regions being applied with a substrate voltage; and an $N^+$-type impurity diffusion region formed on said N-type well, said $N^+$-type impurity diffusion region being applied with the supply voltage through a resistor.

5. A self-refresh period adjustment circuit for a semiconductor memory device as set forth in claim 1, wherein said leakage current detection means includes:

an N-type well formed on a P-type substrate;

a P-type well formed on said N-type well; and an $N^+$-type impurity diffusion region and a $P^+$-type impurity diffusion region formed on said P-type well, said $N^+$-type impurity diffusion region being applied with the supply voltage and said $P^+$-type impurity diffusion region being applied with a substrate voltage through a resistor.

* * * * *